(12) United States Patent
Lin (10) Patent No.: US 7,697,244 B2
(45) Date of Patent: Apr. 13, 2010

(54) MAGNETIC HEAD WITH STABILIZED FERROMAGNETIC SHIELD

(75) Inventor: Tsann Lin, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 657 days.

(21) Appl. No.: 11/423,697

(22) Filed: Jun. 12, 2006

(65) Prior Publication Data

US 2007/0285847 A1 Dec. 13, 2007

(51) Int. Cl.
*G11B 5/127* (2006.01)

(52) U.S. Cl. .................................................. 360/324.1

(58) Field of Classification Search ............. 360/324.1, 360/324.11, 324.12, 324.2, 327.2, 327.3, 360/324

See application file for complete search history.

(56) References Cited

U.S. PATENT DOCUMENTS

| | | | | |
|---|---|---|---|---|
| 4,103,315 | A | 7/1978 | Hempstead et al. ......... | 360/110 |
| 4,814,921 | A | 3/1989 | Hamakawa et al. ......... | 360/126 |
| 5,032,945 | A | 7/1991 | Argyle et al. ............... | 360/126 |
| 5,089,334 | A | 2/1992 | Mallary et al. .............. | 428/336 |
| 5,729,410 | A * | 3/1998 | Fontana et al. ........... | 360/324.2 |
| 5,792,547 | A | 8/1998 | Liu et al. .................... | 428/212 |
| 6,358,635 | B1 | 3/2002 | Min et al. .................... | 428/692 |
| 6,437,949 | B1 | 8/2002 | Macken et al. .............. | 360/319 |
| 6,456,467 | B1 | 9/2002 | Mao et al. .................... | 360/319 |
| 6,496,335 | B2 | 12/2002 | Gill ............................. | 360/319 |
| 6,624,985 | B1 * | 9/2003 | Freitag et al. ............. | 360/324.1 |
| 6,628,478 | B2 | 9/2003 | Gill ............................. | 360/126 |
| 7,002,782 | B2 * | 2/2006 | Hasegawa et al. ...... | 360/324.12 |
| 7,310,207 | B2 * | 12/2007 | Hasegawa et al. ...... | 360/324.11 |
| 2002/0034054 | A1 | 3/2002 | Michel et al. ................ | 360/319 |
| 2003/0189802 | A1 * | 10/2003 | Morinaga et al. ....... | 360/324.12 |
| 2004/0120074 | A1 | 6/2004 | Okada et al. ................. | 360/126 |
| 2004/0165320 | A1 * | 8/2004 | Carey et al. ............ | 360/324.11 |
| 2005/0201022 | A1 * | 9/2005 | Horng et al. ........... | 360/324.11 |
| 2006/0193089 | A1 * | 8/2006 | Li et al. .................. | 360/324.11 |
| 2007/0035888 | A1 * | 2/2007 | Sbiaa et al. ............... | 360/324.1 |
| 2007/0146939 | A1 * | 6/2007 | Pinarbasi ................ | 360/324.11 |
| 2007/0211392 | A1 * | 9/2007 | Zeltser ................... | 360/324.11 |
| 2007/0253123 | A1 * | 11/2007 | Freitag et al. .......... | 360/324.12 |

FOREIGN PATENT DOCUMENTS

| | | |
|---|---|---|
| JP | 1283907 | 11/1989 |
| JP | 4098608 | 3/1992 |
| JP | 7135111 | 5/1995 |
| JP | 7296322 | 11/1995 |
| JP | 9069211 | 3/1997 |

* cited by examiner

*Primary Examiner*—Mark Blouin
(74) *Attorney, Agent, or Firm*—Zilka-Kotab, PC (57) ABSTRACT

A magnetic head in one embodiment includes first and second ferromagnetic shield layers, first and second nonmagnetic read-gap layers positioned between the first and second ferromagnetic shield layers, a sensor used in a current-in-plane (CIP) mode, first and second longitudinal bias layers electrically coupled with the sensor, and first and second conducting layers electrically coupled with the first and second longitudinal bias layers, respectively.

19 Claims, 10 Drawing Sheets

MAGNETIC HEAD WITH STABILIZED FERROMAGNETIC SHIELD

FIELD OF THE INVENTION

The invention relates to a transducer of write and/or read heads used for longitudinal and/or perpendicular magnetic recording at ultrahigh densities in a data storage system, and more particularly to stabilized ferromagnetic shields in the transducer assembly of write and/or read heads.

BACKGROUND OF THE INVENTION

The heart of a computer for longitudinal recording is a magnetic disk drive which includes a rotating magnetic disk, a slider that has a transducer of write and read heads, a suspension arm above the rotating magnetic disk, and an actuator arm that swings the suspension arm to place the transducer of write and read heads over selected circular tracks on the rotating magnetic disk. When the magnetic disk is stationary, the suspension arm biases the slider towards contact with the surface of the magnetic disk. When the magnetic disk rotates, air is swirled by the rotating magnetic disk, causing the slider to ride on an air bearing a slight distance from the surface of the rotating magnetic disk. When the slider rides on the air bearing, the transducer of write and read heads is employed for writing magnetic impressions to and reading magnetic signal fields from the rotating magnetic disk. The transducer of write and read heads is connected to processing circuitry that operates according to a computer program to implement the write and read functions.

A commonly used write head includes first and second write poles, a write gap, a coil, and first, second and third insulator stacks. The write gap, coil and insulator stacks are sandwiched between the first and second write poles. The first and second write poles are connected at the back of the write head. Current conducted to the coil induces a magnetic flux in the first and second write poles which cause a magnetic field to fringe out at the air bearing surface of the write head for the purpose of writing the aforementioned magnetic impressions in circular tracks on the aforementioned rotating magnetic disk.

A commonly used read head includes Ni—Fe first and second shields, $Al_2O_3$ first and second read gaps, a giant magnetoresistance (GMR) sensor in a read region, and longitudinal bias stacks in two side regions. The GMR sensor and the longitudinal bias stacks are sandwiched between the first and second read gaps, which are in turn sandwiched between the first and second shields.

In order to perform longitudinal magnetic recording at ultrahigh densities of above 100 $Gb/in^2$, the read head has been progressively miniaturized by reducing its sensor width to as narrow as 60 nm and its gap length to as narrow as 100 nm. Currently, an even narrower width is explored with electron-beam lithography, while an even narrower read-gap length is explored with a thinner GMR sensor inserted into thinner $Al_2O_3$ first and second read gaps.

On the other hand, the Ni—Fe first and second shields still remain as thick as more than 1,000 nm. These shields must be thick enough to shield the GMR sensor from unwanted magnetic fluxes stemming from a rotating magnetic medium, while allowing the GMR sensor to only receive confined magnetic fluxes during a read process. To ensure shield efficiency, these shields must exhibit anisotropic soft magnetic properties, such as an easy-axis coercivity ($H_{CE}$) of below 10 Oe, a hard-axis coercivity ($H_{CH}$) of below 2 Oe, and an uniaxial anisotropy field ($H_K$) of below 20 Oe. These shields must be also magnetically stable against strong write fields during a write process, in order not to induce noises in the read process. To ensure strong magnetic stability, these shields must exhibit a negative saturation magnetostriction ($\lambda_S$).

For perpendicular magnetic recording recently extensively explored for ever higher densities, a 300 nm thick ferromagnetic film is used as a main write pole, thinner first and second shields are used to minimize thermal extrusion at an air bearing surface, and thinner first and read gaps are used to increase linear densities. Due to this miniaturization of the transducer of the write and read heads, the GMR sensor becomes more susceptible to strong write fields stemming from the nearby main write pole. It thus becomes more stringent for the first and second shields to exhibit strong magnetic stability.

SUMMARY OF THE INVENTION

A magnetic head in one embodiment includes first and second ferromagnetic shield layers, first and second nonmagnetic read-gap layers positioned between the first and second ferromagnetic shield layers, a sensor used in a current-in-plane (CIP) mode, first and second longitudinal bias layers electrically coupled with the sensor, and first and second conducting layers electrically coupled with the first and second longitudinal bias layers, respectively.

A magnetic head in another embodiment includes first and second ferromagnetic shield layers, first and second nonmagnetic conducting layers positioned between the first and second ferromagnetic shield layers, a sensor used in a current-perpendicular-to-plane (CPP) mode, first and second insulating layers at edges of the sensor, and first and second longitudinal bias layers separated by the first and second insulating layers, respectively, from the sensor.

A magnetic head in a further embodiment includes a sensor, and a shield positioned towards the sensor, the shield including a ferromagnetic layer and a pinning layer for stabilizing the ferromagnetic layer.

In one embodiment of the invention, a stabilized ferromagnetic shield used in a magnetic head as above comprises either a basic structure or a laminate of several basic structures in an entire shield frame. The basic structure comprises nonmagnetic films used as seed layers, an antiferromagnetic film used as a pinning layer, and a ferromagnetic film used as a shield layer. The seed layers facilitate both the pinning and shield layers to develop strong antiferromagnetic/ferromagnetic exchange coupling characterized by a unidirectional anisotropy field ($H_{UA}$). Preferably, the composition and thickness of the seed, pinning and shield layers are optimized in order to attain a designed $H_{UA}$ high enough to pin the shield layer, and attain a designed $H_K$ low enough for the shield layer to shield the GMR sensor. This stabilized ferromagnetic shield exhibits strong magnetic stability for longitudinal and perpendicular magnetic recording.

In an alternate embodiment of the invention, a stabilized ferromagnetic shield comprises either the basic structure or the laminate of several basic structures in each of two side regions of the shied frame, and only a shield layer in the central region of the shield frame. The basic structure comprises nonmagnetic films used as seed layers, an antiferromagnetic film used as a pinning layer, and a ferromagnetic film used as a bias layer. The seed layers facilitate both the pinning and bias layers to develop strong antiferromagnetic/ferromagnetic exchange coupling. Preferably, the composition and thickness of the seed, pinning and bias layers are optimized in order to attain a designed $H_{UA}$ as high as possible to stabilize the shield layer through magnetostatic interactions.

Other aspects and advantages of the invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the invention, as well as the preferred mode of use, reference should be made to the following detailed description read in conjunction with the accompanying drawings.

BEST MODE FOR CARRYING OUT THE INVENTION

The following description is the best mode presently contemplated for carrying out the invention. This description is made for the purpose of illustrating the general principles of the present invention and is not meant to limit the inventive concepts claimed herein. Further, particular features described herein can be used in combination with other described features in each of the various possible combinations and permutations.

Figure 1:
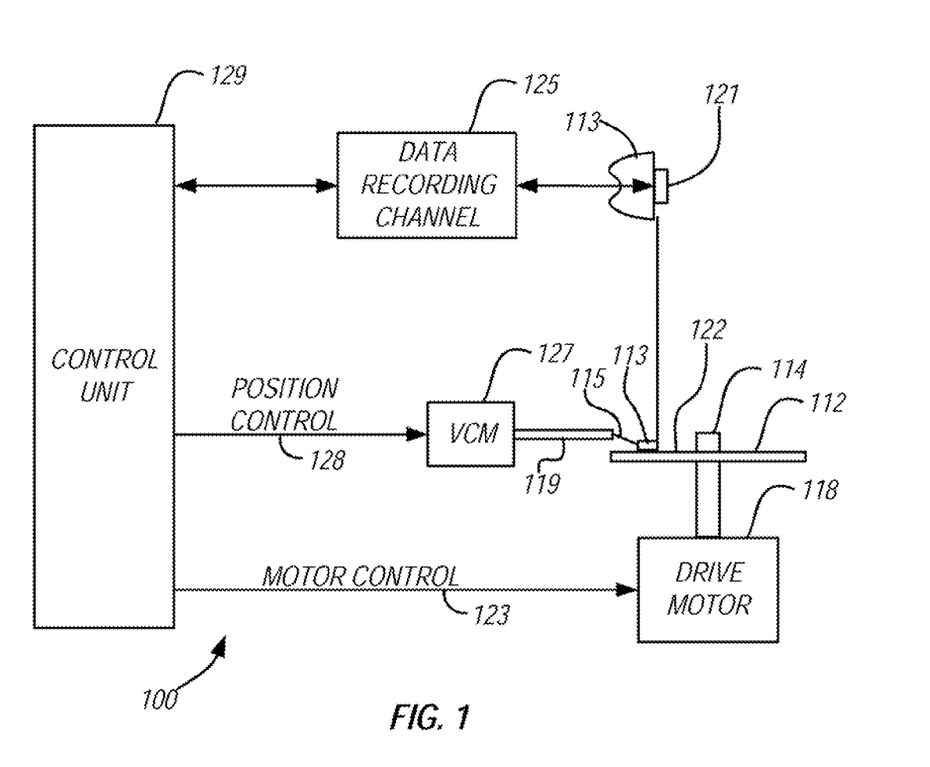
FIG. 1 is a simplified drawing of a data storage system wherein the invention is embodied.

Referring now to FIG. 1, there is shown a disk drive 100 which may be used in conjunction with the invention. As shown in FIG. 1, at least one rotatable magnetic disk 112 is supported on a spindle 114 and rotated by a disk drive motor 118. The longitudinal or perpendicular magnetic recording on each magnetic disk 112 is in the form of an annular pattern of concentric data tracks (not shown) on the magnetic disk 112. At least one slider 113 is positioned near the magnetic disk 112, each slider 113 supporting one or more transducer of write and read heads 121. More information regarding such transducer of write and read heads 121 will be set forth hereinafter. As the magnetic disk 112 rotates, the slider 113 is moved radially in and out over the disk surface 122 so that the transducer of write and read heads 121 may access different tracks of the magnetic disk 112 where desired data are recorded. Each slider 113 is attached to an actuator arm 119 means of a suspension 115. The suspension 115 provides a slight spring force which biases the slider 113 against the disk surface 122. Each actuator arm 119 is attached to an actuator means 127. The actuator means 127 may be a voice coil motor (VCM). The VCM comprises a coil movable within a fixed magnetic field, the direction and speed of the coil movements being controlled by the motor current signals supplied by a control unit 129.

During operation of the data storage system 100, the rotation of the magnetic disk 112 generates an air bearing between the slider 113 and the disk surface 122 which exerts an upward force or lift on the slider 113. The air bearing thus counter-balances the slight spring force of the suspension 115 and supports the slider 113 off and slightly above the disk surface 122 by a small, substantially constant spacing during normal operation.

The various components of the data storage system 100 are controlled in operation by control signals generated by the control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position the slider 113 to the desired data track on the magnetic disk 112. Write and read signals are communicated to and from the transducer of write and read heads 121 by way of a recording channel 125.

The above description of the typical data storage system and the accompanying illustration of FIG. 1 are for representation purposes only. It should be apparent that data storage systems may contain a large number of magnetic disks and actuators, and each actuator may support a number of sliders.

Figure 2A:
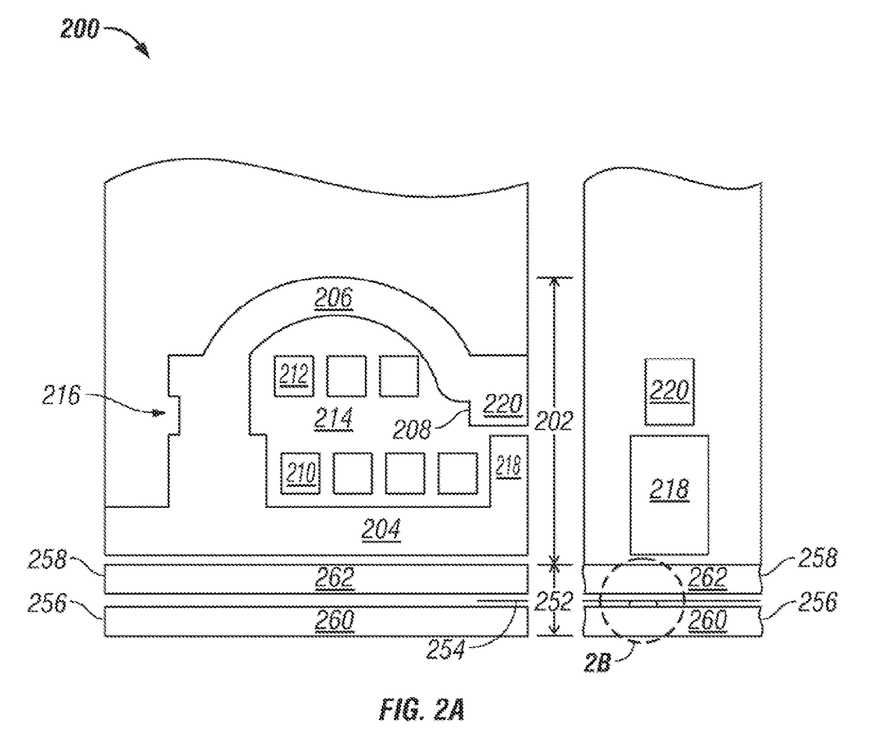
FIGS. 2A and 2B are cross-sectional views in planes perpendicular and parallel to the ABS, respectively, of a transducer of write and read heads used for longitudinal magnetic recording. The read head includes a GMR sensor used in a CIP mode.
Figure 2B:
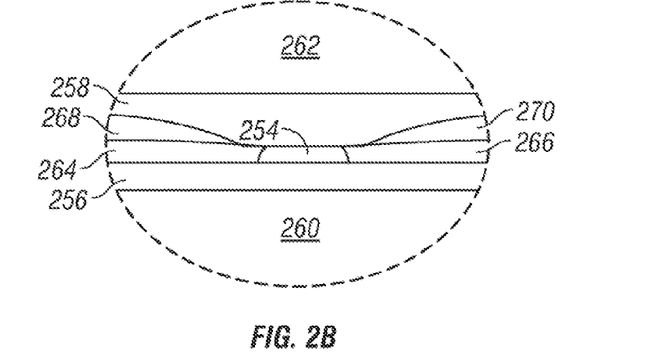

FIGS. 2A and 2B show cross-sectional views in planes perpendicular and parallel to the ABS, respectively, of a transducer of write and read heads 200 used for longitudinal magnetic recording according to one embodiment of the invention. The transducer of write and read heads 200 includes a write head 202 and a read head 252.

The write head 202 includes first and second write poles 204 and 206, a write gap 208, first and second coils 210, 212, and an insulation stack 214. The write-gap 208, the first and coils 210, 212, and the insulation stack 214 are sandwiched between the first and second write poles 204, 206. The first and second write poles 204, 206 are magnetically coupled at a back gap 216.

The read head 252 shown includes a giant magnetoresistance (GMR) sensor 254 used in a current-in-plane (CIP) mode, first and second nonmagnetic electrically insulating read-gaps 256, 258, first aid second ferromagnetic shields 260, 262, first and second longitudinal bias layers 264, 266, and first and second electrically conducting layers 268, 270. The GMR sensor 254 is sandwiched between the first and second read gaps 256, 258, which are in turn sandwiched between the first and second shields 260, 262. In addition, the GMR sensor 254 is connected with the first and second longitudinal bias layers 264, 266, which are in turn connected with the first and second conducting layers 268, 270, respectively. In response to external magnetic fields, the resistance of the GMR sensor 254 changes. A sense current conducted through the first longitudinal bias and conducting layers 264, 268, the GMR sensor 254, the second longitudinal bias and conducting layers 266, 270 causes these resistance changes to be manifested as potential changes. These potential changes are then processed as readback signals by the processing circuitry 129 as shown in FIG. 1.

Figure 3A:
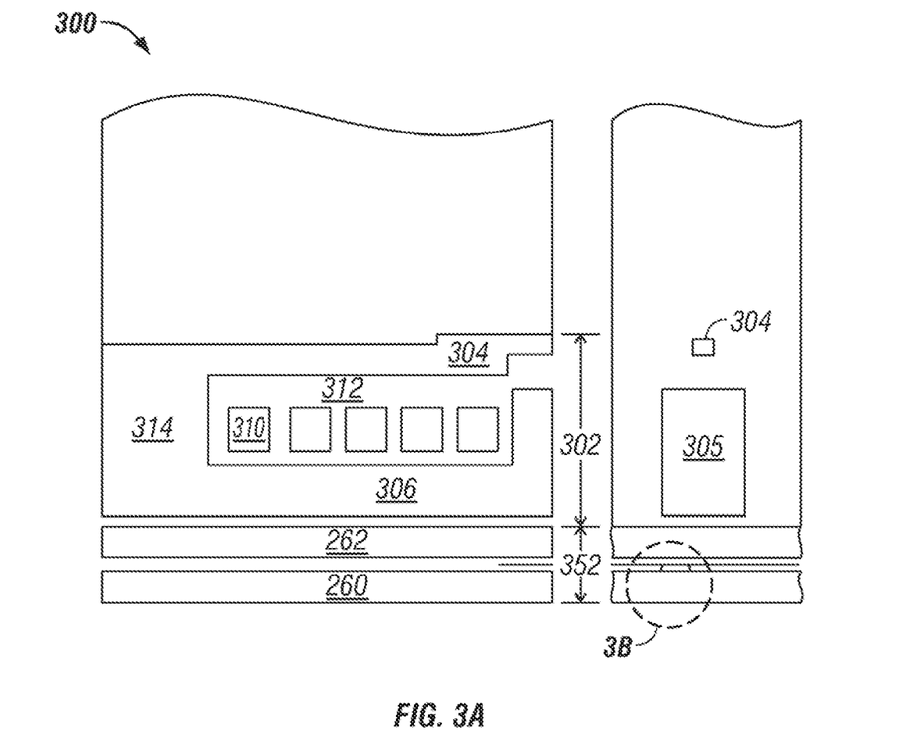
FIGS. 3A and 3B are cross-sectional view in planes perpendicular to and parallel to the ABS, respectively, of a transducer of write and read heads used for perpendicular magnetic recording. The read head includes a GMR sensor used in a CIP mode.
Figure 3B:
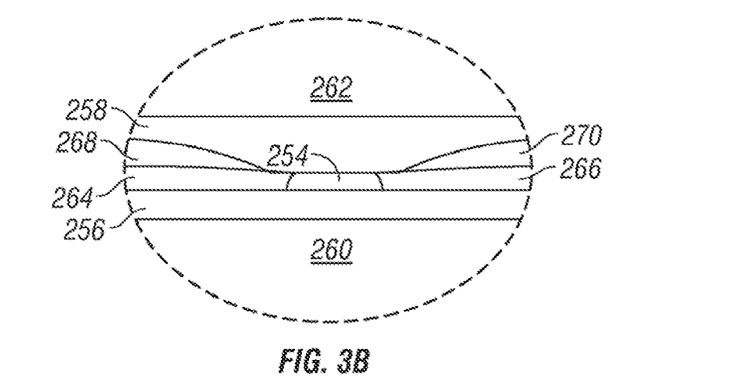

FIGS. 3A and 3B are cross-sectional views in planes perpendicular and parallel to the ABS, respectively, of a transducer of write and read heads 300 used for perpendicular magnetic recording. The transducer of write and read heads 300 includes a write head 302 and a read head 252.

The write head 302 includes a main write pole 304, an auxiliary pole 306, a coil 310, and an insulation stack 312. The coil 310 and the insulation stack 312 are sandwiched between the main write pole 304 and the auxiliary pole 306. The main write pole 304 and the auxiliary pole 306 are magnetically coupled at a back gap 314.

Figure 4A:
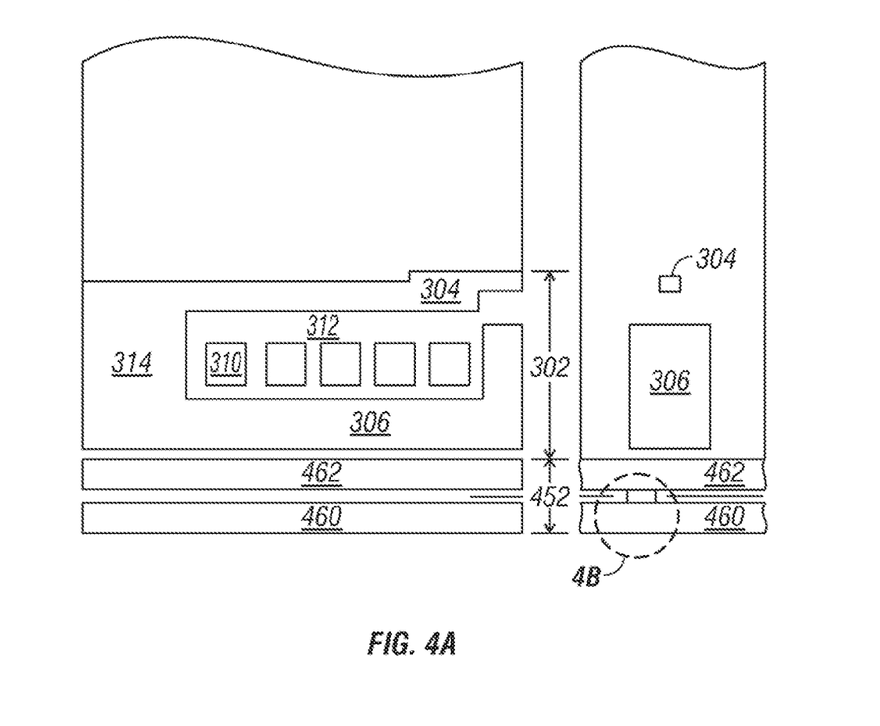
FIGS. 4A and 4B are cross-sectional view in planes perpendicular to and parallel to the ABS, respectively, of a transducer of write and read heads used for perpendicular magnetic recording. The read head includes a TMR sensor used in a CPP mode.
Figure 4B:
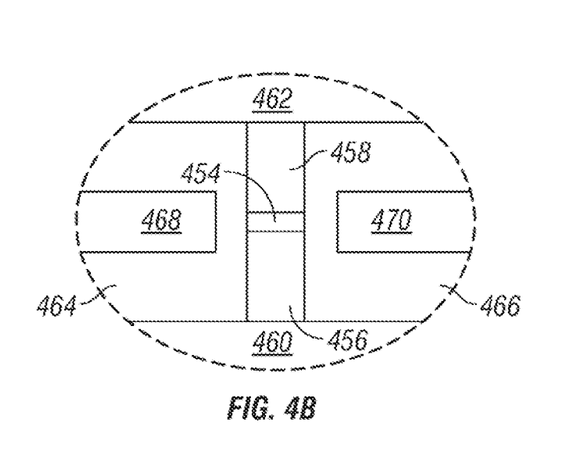

FIGS. 4A and 4B are cross-sectional views in planes perpendicular and parallel to the ABC, respectively of a transducer of write and read heads 400 used for perpendicular magnetic recording. The transducer of write and read heads 400 includes a write head 302 and a read head 452.

The read head 452 includes a tunnel magnetoresistance (TMR) sensor 454 used in a current-perpendicular-to-plane (CPP) mode, first and second electrically conducting layers 456, 458, and first and second ferromagnetic shields 460, 462, first and second insulating layers 464, 466, and first and second longitudinal bias layers 468, 470. The TMR sensor 454 is electrically connected with the first and second conducting layers 456, 458, which are in turn electrically connected with the first and second shields 460, 462, respectively. In addition, the TMR sensor 454 is isolated by the first insulating layer 464 from the first longitudinal bias layer 468, and is isolated by the second insulating layer 466 from the second longitudinal bias layer 470. In response to external magnetic fields, the resistance of the TMR sensor 454 changes. A sense current conducted through the first shield 460, the first conducting layer 456, the TMR sensor 454, the second conducting layer 458, and the second shield 462 causes these resistance changes to be manifested as potential changes. These potential changes are then processed as readback signals by the processing circuitry 129 as shown in FIG. 1.

One embodiment of the invention includes a basic structure in the transducers of write and read heads 200, 300 and 400 as shown FIGS. 2A-B, 3A-B and 4A-B, respectively. The basic structure preferably includes Al—O(3)/Ni—Cr—Fe(3.2)/Ni—Fe(0.4) films (physical thickness $\delta_M$ in nm) used as seed layers, an antiferromagnetic Ir—Mn—Cr(7.5) films used as a pinning layer, and a ferromagnetic Co—Fe(300*) film (magnetic thickness $\delta_M$ in nm, which is determined from $(\delta_M)_{Co-Fe}=(M_S\delta_P)_{Co-Fe}/(M_S)_{85Ni-15Fe}$, where $M_S$ is a saturation magnetization and is determined to be 700 emu/cm² for a 85Ni-15Fe (composition in atomic percent) film) used as the shield layer. In contrast to the prior art where sputtering is used to deposit a ferromagnetic Ni—Fe(80*) film as a seed layer and plating is used to deposit a ferromagnetic Ni—Fe (1,000*) film as a shield layer, only sputtering is used to deposit the basic structure. Also, the ferromagnetic Co—Fe film is preferably selected for shielding.

Figure 5:
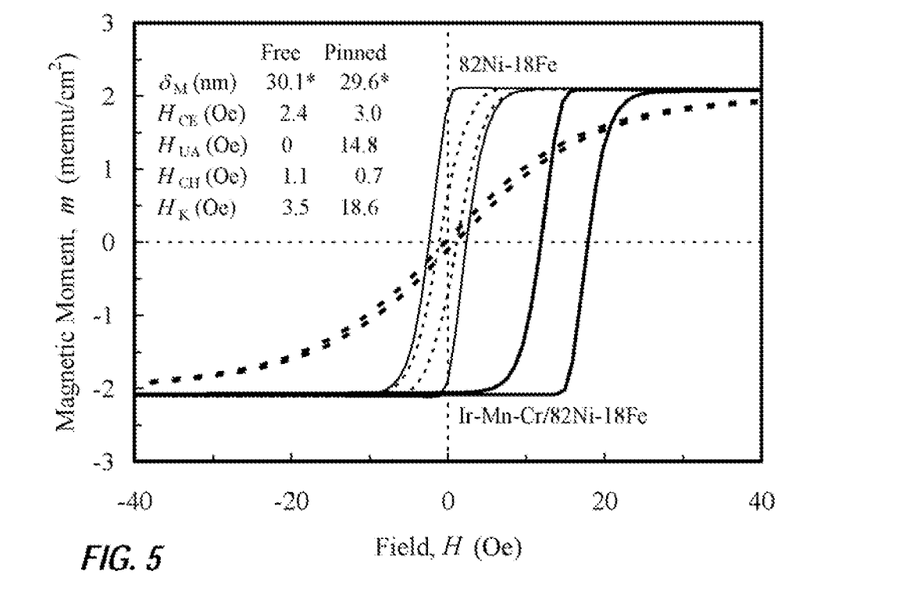
FIG. 5 is a chat showing easy-axis and hard-axis hysteresis loops of 82Ni—18Fe(30*) and Al—O(3)/Ni—Cr—Fe(3.2)/Ni—Fe(0.4)/Ir—Mn—Cr(7.5)/82Ni—18Fe(30*) films (number without *: physical thickness in nm; number with *: magnetic thickness in nm).
Figure 6:
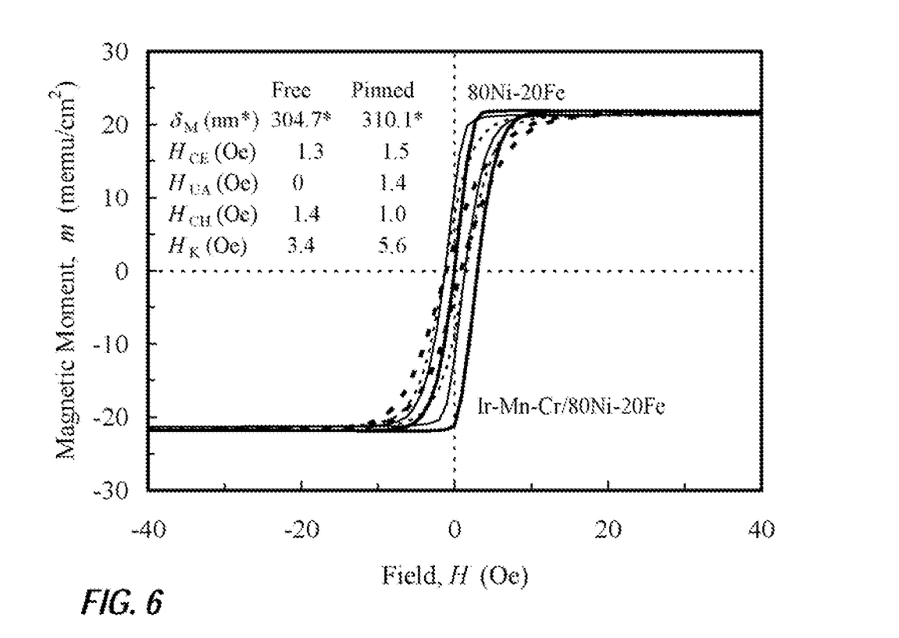
FIG. 6 is chart showing easy-axis and hard-axis hysteresis loops of 82Ni—10Fe(300*) and Al—O(3)/Ni—Cr—Fe(3.2)/Ni—Fe(0.4)/Ir—Mn—Cr(7.5)/82Ni—18Fe(300*) films.

In the prior art, a ferromagnetic 82Ni—18Fe film deposited mainly with plating has shown good soft ferromagnetic properties, including a low easy-axis coercivity ($H_{CE}$), a nearly zero hard-axis coercivity ($H_{CH}$), an optimal uniaxial anisotropy field ($H_K$), and a nearly zero saturation magnetostriction ($\lambda_S$), and thus has been successfully used as the shield layer. In various embodiments of the invention, however, a ferromagnetic 82NI—18Fe film deposited with sputtering only is not recommended due to three concerns. First, the plating provides a "cold" deposition process, which causes the ferromagnetic Ni—Fe film even as thick as 2,000 nm to maintain a fine-grain morphology and thus exhibit good soft ferromagnetic properties required for shielding. However, the sputtering provides a "hot" deposition process, which causes the ferromagnetic Ni—Fe film to develop a columnar-grain morphology during deposition, and thus exhibit poor ferromagnetic properties. FIG. 5 shows easy-axis and hard-axis hysteresis loops of 82Ni—18Fe(30*) and Al—O(2)/Ni—Cr—Fe(3.2)/Ni—Fe(0.4)/Ir—Mn—Cr(7.5)/82Ni—18Fe(30*) films. The Ni—Fe(30*) film exhibits good soft ferromagnetic properties, but a non-well-defined anisotropy. FIG. 6 shows easy-axis and hard-axis hysteresis loops of 82Ni—18Fe (300*) and Al—O(2)/Ni—Cr—Fe(3.2)/Ni—Fe(0.4)/Ir—Mn—Cr(7.5)/82Ni—18Fe(300*) films. The Ni—Fe(300*) film exhibits very poor isotropic ferromagnetic properties, mainly due to overheating during deposition. Second, the unidirectional anisotropy field ($H_{UA}$) induced by exchange coupling between the antiferromagnetic Ir—Mn—Cr and ferromagnetic Ni—Fe films is too low to be used for longitudinal pinning. As shown in FIG. 5, the easy-axis hysteresis loop of the Ir—Mn—Cr(7.5)/Ni—Fe(30*) films is shifted by an $H_{UA}$ of as low as 22.2 Oe, corresponding to an intrinsic exchange coupling energy $J_K$ (calculated from $J_K=M_S\delta_P H_{UA}$) of as low as 0.03 erg/cm². Based on the inverse linear relationship between $\delta_P$ (or $\delta_M$) and $H_{UA}$, $H_{UA}$ is calculated to be as low as 2.2 Oe for the Ni—Fe(300*) film. As shown in FIG. 6, with such a $H_{UA}$ much lower than an easy-axis coercivity ($H_{CE}$), the easy-axis hysteresis loop of the Ir—Mn—Cr(7.5)/Ni—Fe (300*) films is not shifted at all. Third, the Ni—Fe film is too thick, leading to a concern on stress-induced write pole extrusion during mechanical lapping. A Co—Fe film, that exhibits an $M_S$ higher than the Ni—Fe film and can be thinner for the same magnetic moment as the Ni—Fe film, is thus desired.

Figure 7:
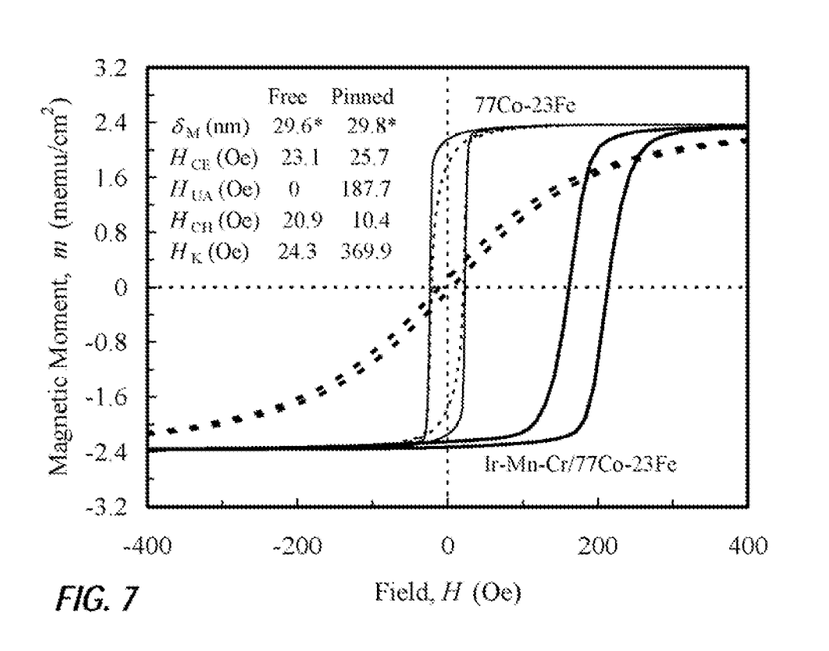
FIG. 7 is a chart showing easy-axis and hard-axis hysteresis loops of 77Co—23Fe(30*) and Al—O(3)/Ni—Cr—Fe(3.2)/Ni—Fe(0.4)/Ir—Mn—Cr(7.5)/77Co—23Fe(30*) films.
Figure 8:
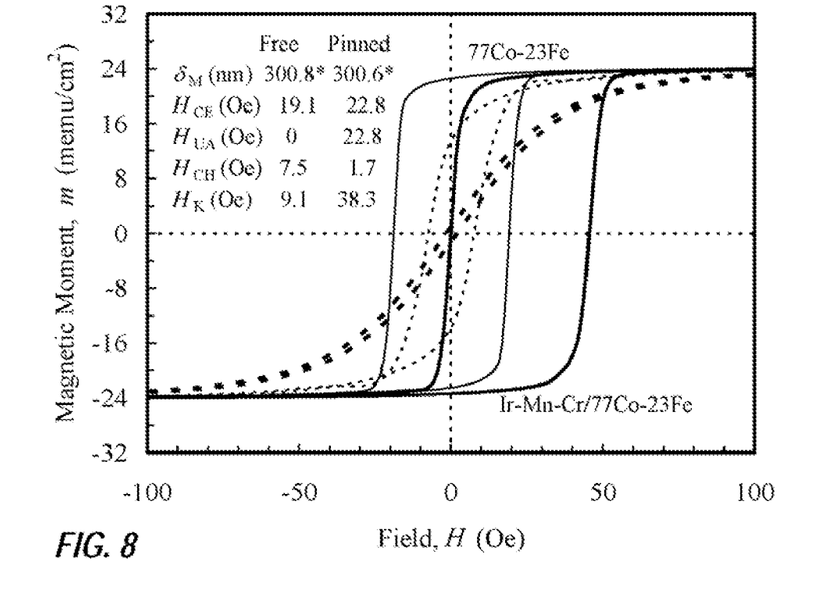
FIG. 8 is a chart showing easy-axis and hard-axis hysteresis loops of 77Co—23Fe(300*) and Al—O(3)/Ni—Cr—Fe(3.2)/Ni—Fe(0.4)/Ir—Mn—Cr(7.5)/77Co—23Fe(300*) films.

The Co—Fe film deposited with either sputtering or plating, on the other hand, inherently exhibits isotropic ferromagnetic properties worse than the Ni—Fe film. FIG. 7 shows easy-axis and hard-axis hysteresis loops of 77Co—23Fe (30*) and Al—O(3)/Ni—Cr—Fe(3.2)/Ni—Fe(0.4)/Ir—Mn—Cr(7.5)/77Co—23Fe(30*) films. The Co—Fe(30*) film exhibits almost no anisotropy at all, since its $H_{CE}$ and hard-axis coercivity ($H_{CH}$) are nearly identical. FIG. 8 shows easy-axis and hard-axis hysteresis loops of 77Co—23Fe (300*) and Al—O(3)/Ni—Cr—Fe(3.2)/Ni—Fe(0.4)/Ir—Mn—Cr(7.5)/77Co—23Fe(300*) films. The Co—Fe(300*) film still exhibits poor isotropic ferromagnetic properties. However, the unidirectional anisotropy field ($H_{UA}$) induced by exchange coupling between the antiferromagnetic Ir—Mn—Cr and ferromagnetic Co—Fe films is high enough to be used for pinning. As shown in FIG. 7, the easy-axis hysteresis loop of the Ir—Mn—Cr(7.5)/Co—Fe(30*) films is shifted by an $H_{UA}$ of as high as 187.7 Oe, corresponding to an intrinsic exchange coupling energy $J_K$ of as high as 0.43 erg/cm². As shown in FIG. 8, even when the Co—Fe film is as thick as 300* nm, $H_{UA}$ is still as high as 22.8 Oe. In addition to such an optimal $H_{UA}$ for pinning, the Ir—Mn—Cr/Co—Fe films also exhibit a very well defined anisotropy and an optimal $H_K$ of 38.3 Oe, corresponding to a permeability μ (calculated from $\mu=4\pi M_S/H_K$) of 262. Such a permeability is high enough to receive a large amount of unwanted magnetic fluxes stemming from a recording medium and thus shield the GMR sensor.

Al—O, Ni—Cr—Fe and Ni—Fe films with optimal compositions and thicknesses are used as the seed layers of the basic structure in one embodiment of the invention. The amorphous Al—O film is used for the overlying Ni—Cr—Fe, Ni—Fe, Ir—Mn—Cr and Co—Fe films to grow freely in each basic structure, so that the same magnetic properties can be attained in each basic structure. The polycrystalline Ni—Cr—Fe and Ni—Fe films cause grain coarsening, thereby facilitating the overlying Ir—Mn—Cr and Co—Fe films to develop very strong antiferromagnetic/ferromagnetic exchange coupling. The Ir—Mn—Cr film exhibits unexpected strong antiferromagnetism, and this strong antiferromagnetism still remains even the Mn content reaches as low as 70 at % and the Cr content reaches as high as 10 at %. A lower Mn content and a higher Cr content can thus be used to ensure high corrosion resistance.

Figure 9:
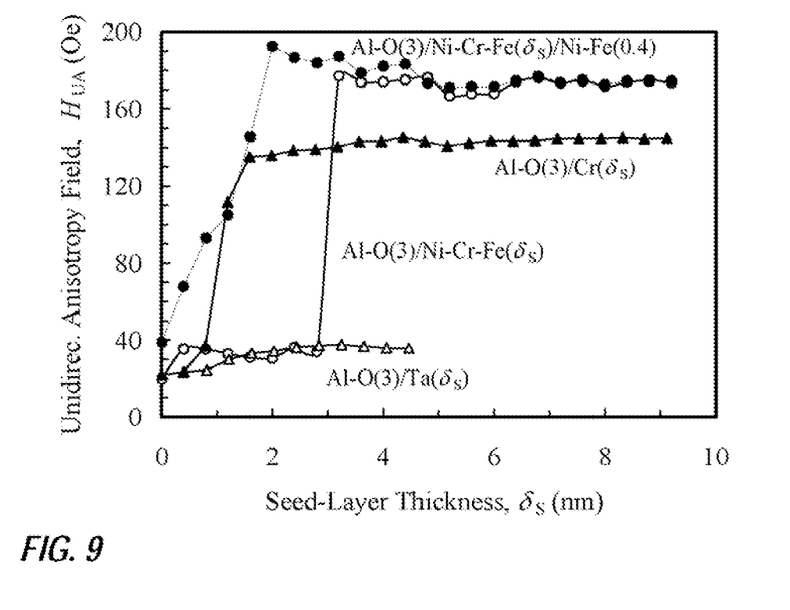
FIG. 9 is a chart showing $H_{UA}$ versus the seed-layer thickness for Ir—Mn—Cr(7.5)/77Co—23Fe(30*) films with various seed layers.

Other amorphous and polycrystalline films can also be used as seed layers of the basic structure. FIG. 9 shows $H_{UA}$ versus the seed-layer thickness for Ir—Mn—Cr(7.5)/77Co—23Fe(30*) films with various seed layers. The Al—O(3)/Ta (3)/Ru(3) films also appear to be suitable seed layers.

Figure 10:
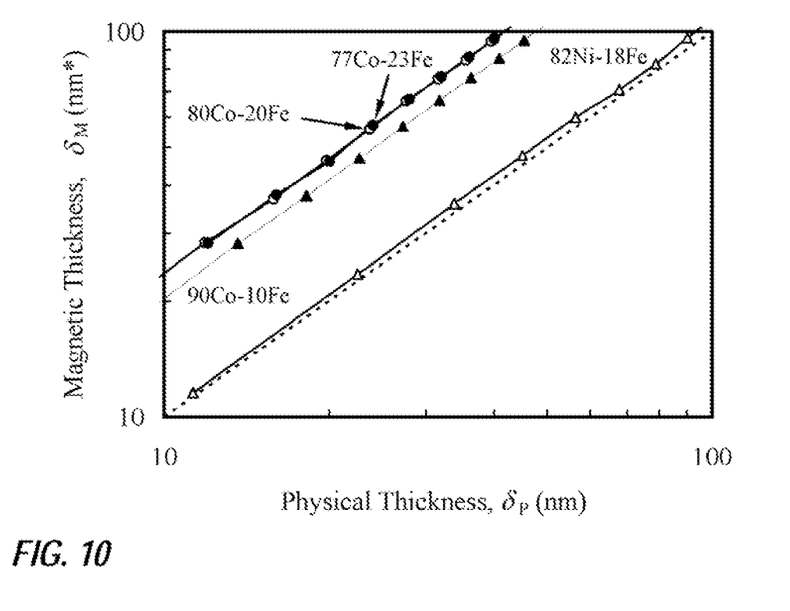
FIG. 10 is a chart showing the magnetic thickness versus the physical thickness for Al—O(3)/Ni—Cr—Fe(3.2)/Ni—Fe(0.4)/Ir—Mn—Cr(7.5)/Ni—Fe and Al—O(3)/Ni—Cr—Fe(3.2)/Ni—Fe(0.4)/Ir—Mn—Cr(7.5)/Co—Fe films.
Figure 11:
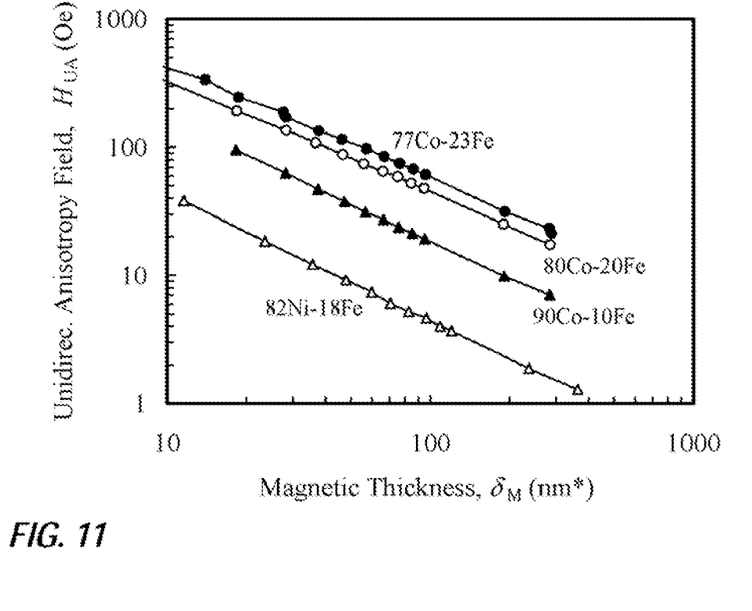
FIG. 11 is a chart showing $H_{UA}$ versus the magnetic thickness for Al—O(3)/Ni—Cr—Fe(3.2)/Ni—Fe(0.4)/Ir—Mn—Cr(7.5)/Ni—Fe and Al—O(3)/Ni—Cr—Fe(3.2)/Ni—Fe(0.4)/Ir—Mn—Cr(7.5)/Co—Fe films.
Figure 12:
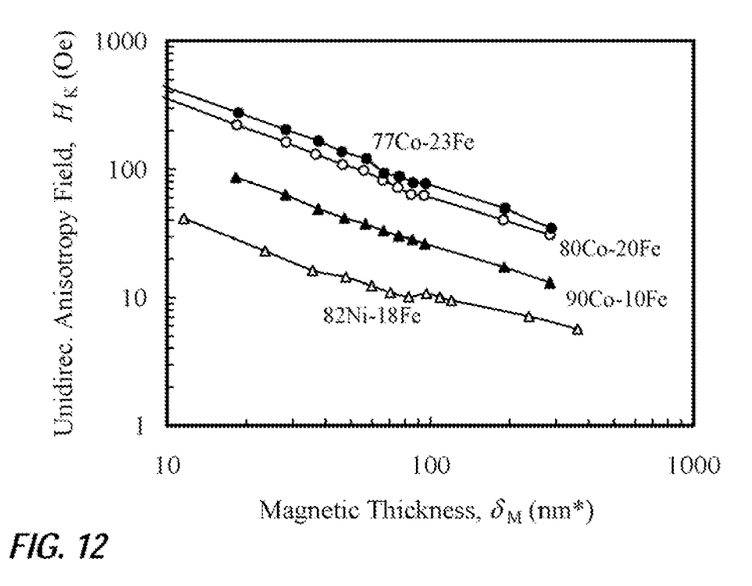
FIG. 12 is a chart showing $H_K$ versus the magnetic thickness for Al—O(3)/Ni—Cr—Fe(3.2)/Ni—Fe(0.4)/Ir—Mn—Cr(7.5)/Ni—Fe and Al—O(3)/Ni—Cr—Fe(3.2)/Ni—Fe(0.4)/Ir—Mn—Cr(7.5)/Co—Fe films.

The composition of the Co—Fe film bust be optimized for the use as the shield layer. FIG. 10 shows the magnetic thickness ($\delta_M$) versus the physical thickness ($\delta_P$) for Al—O(3)/Ni—Cr—Fe(3.2)/Ni—Fe(0.4)/Ir—Mn—Cr(7.5)/Ni—Fe and Al—O(3)/Ni—Cr—Fe(3.2)/Ni—Fe(0.4)/Ir—Mn—Cr (7.5)/Co—Fe films. The 77Co—23Fe film shows the highest $M_S$ indicating that the 77Co—23Fe film requires the smallest physical thickness to attain a designed magnetic thickness thus minimizing concerns on stress-induced write-pole extrusion during mechanical lapping. FIG. 11 shows $H_{UA}$ versus magnetic thickness for the same basic structures. The Ir—Mn—Cr/77Co—23Fe films show the highest $J_K$, indicating that the 77Co—23Fe film with a designed magnetic thickness can be pinned more rigidly than others. FIG. 12 shows $H_K$ versus magnetic thickness for the same basic structures. The Ir—Mn—Cr/77Co—23Fe films show an optimal $H_K$ range. Table 1 lists magnetic properties of these basic structures with 300* nm. The 77Co—23Fe film indeed appears to be the best choice, mainly due to its high $M_S$, high $J_K$ and optimal $H_K$.

TABLE 1

Magnetic properties of Ir—Mn—Cr/Ni—Fe(300*) and Ir—Mn—Cr/Co—Fe(300*) films.

|  | Ir—Mn—Cr/ 82Ni—18Fe | Ir—Mn—Cr/ 90Co—10Fe | Ir—Mn—Cr/ 80Co—20Fe | Ir—Mn—Cr/ 77Co—23Fe |
|---|---|---|---|---|
| $M_S$ (memu/cm³) | 786 | 1508 | 1645 | 1667 |
| $J_K$ (erg/cm²) | 0.03 | 0.14 | 0.34 | 0.43 |
| $H_{UA}$ (Oe) | 1.3 | 7.1 | 17.3 | 21.3 |
| $H_K$ (Oe) | 5.7 | 13.1 | 30.9 | 34.7 |

Figure 13:
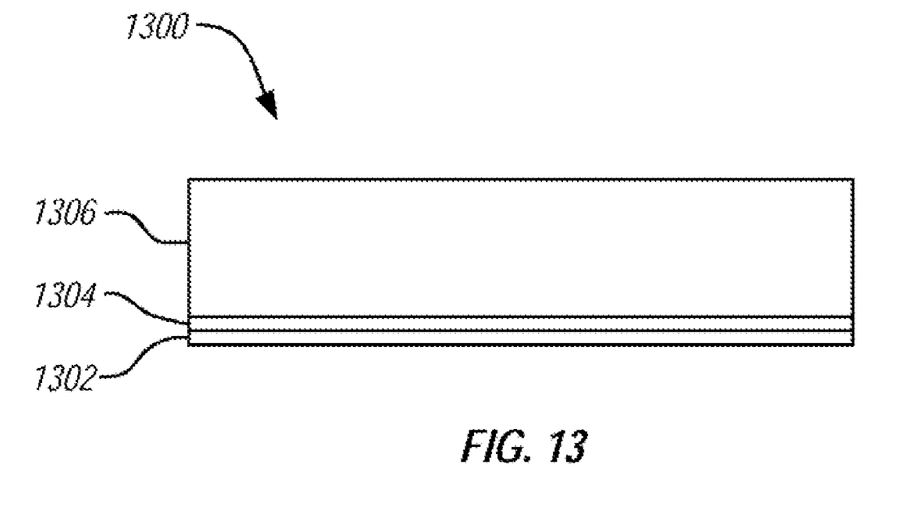
FIG. 13 is a cross sectional view in a plane parallel to the ABS of a stabilized ferromagnetic shield comprising a basic structure in an entire shield frame according to one embodiment of the invention.

FIG. 13 shows a basic structure 1300 used as a stabilized shield in an entire shield frame. The basic structure 1300 preferably comprises Al—O(3)/Ni—Cr—Fe(3.2)/Ni—Fe (0.4) films used as seed layers 1302, an antiferromagnetic Ir—Mn—Cr(7.5) film used as a pinning layer 1304, and a ferromagnetic 77Co—23Fe(120 or 300*) film used as the shield layer 1306. In the fabrication process of a read head, a basic structure comprising the Al—O/Ni—Cr—Fe/Ni—Fe/Ir—Mn—Cr/Co—Fe films is deposited in a deposition field of 100 Oe on an entire wafer, and are annealed in a field of 200 Oe for 2 hours at 240° C. in a direction parallel to the deposition field. A monolayer photoresist is applied and patterned in a photolithographic tool to mask the shield frame. Ion milling is then applied to entirely remove the basic structure in exposed regions. After removing the monolayer photoresist, the basic structure is formed in the shield frame.

Figure 14:
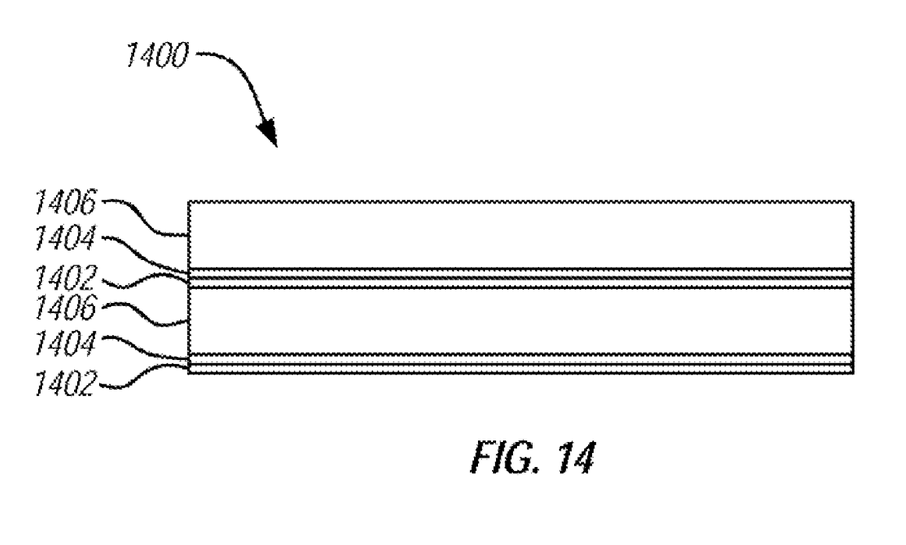
FIG. 14 is a cross sectional view in a plane parallel to the ABS of a stabilized ferromagnetic shield comprising a laminate of several basic structures in an entire shield frame according to one embodiment of the invention.

FIG. 14 shows a laminate of the basic structure 1400 in the entire shield frame. The basic structure 1400 preferably comprises Al—O(3)/Ni—Cr—Fe(3.2)/Ni—Fe(0.4) films used as seed layers 1402, an antiferromagnetic Ir—Mn—Cr(7.5) film used as a pinning layer 1404, and a ferromagnetic 77Co—23Fe(60 or 150*) film used as a shield layer 1406. In the fabrication process of a read head, two laminates of the basic structure comprising the Al—O/Ni—Cr—Fe/Ni—Fe/Ir—Mn—Cr/Co—Fe films are deposited in a deposition field of 100 Oe on an entire wafer, and are annealed in a field of 200 Oe for 2 hours at 240° C. in a direction parallel to the deposition field. A monolayer photoresist is applied and patterned in a photolithographic tool to mask the shield frame. Ion milling is then applied to entirely remove the two laminates in exposed regions. After removing the monolayer photoresist, the two laminates of the basic structures are formed in the shield frame. In addition, more laminate of the basic structure can also been used as the stabilized shield.

The merit of using the laminate of the basic structure is that $H_{UA}$ and $H_K$ can be finely tuned by varying the magnetic thickness in each basic structure per design needs. The number of the laminate is determined by the ratio of the designed magnetic thickness to the magnetic thickness in each basic structure. This number is preferably minimized, and thus the 77Co—23Fe film exhibiting the highest $J_K$ is selected.

Either the basic structure as shown in FIG. 13 or the laminate of the basic structure as shown in FIG. 14 appears to be viable as the first shield, but not viable as the second shield due to an unwanted additional separation by the seed and pinning layers between the second read gap and the second shield. This unwanted separation can be removed, by utilizing either the basic structure or the laminate of the basic structure only in each of two side regions of the shield frame of the second shield layer, as described below.

Figure 15:
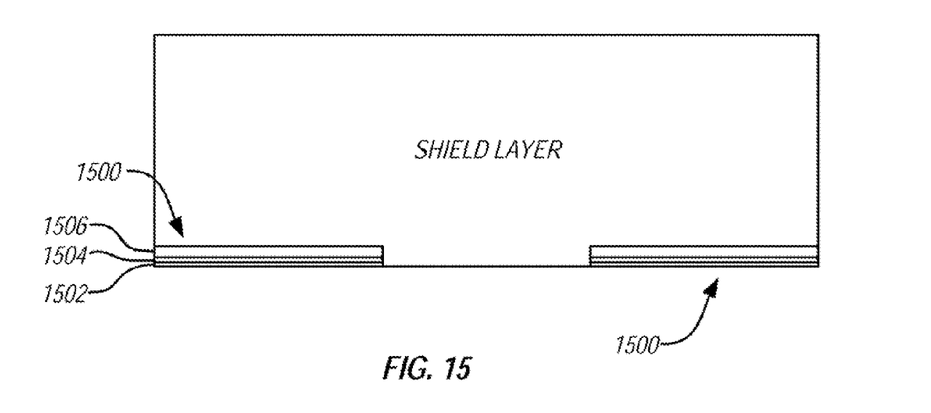
FIG. 15 is a cross sectional view in a plane parallel to the ABS of a stabilized ferromagnetic shield comprising a basic structure in each of two side regions of the shield frame and only a shield layer in a central of the shield frame according to one embodiment of the invention.

FIG. 15 shows a shield comprising the basic structure 1500 in each of the two side region of a shield frame. The basic structure 1500 preferably comprises Al—O(3)/Ni—Cr—Fe (3.2)/Ni—Fe(0.4) films used as seed layers 1502, an antiferromagnetic Ir—Mn—Cr(7.5) film used as a pinning layer 1504, and a ferromagnetic 77Co—23Fe(12 or 30*) film used as a bias layer 1506. In the fabrication process of a read head, the basic structure comprising the Al—O/Ni—Cr—Fe/Ni—Fe/Ir—Mn—Cr/Co—Fe films is deposited in a deposition field of 100 Oe on an entire wafer, and are annealed in a field of 200 Oe for 2 hours at 240° C. in a direction parallel to the deposition field. A monolayer photoresist is applied and patterned in a photolithographic tool to expose only the central region of the shield frame. Ion milling is then applied to entirely remove the basic structure in the exposed central region. After removing the monolayer photoresist, a 82Ni—18Fe (300*) film is deposited on the entire wafer. Another monolayer photoresist is applied and patterned in a photolithographic tool to mask the shield frame. Ion milling is then applied to entirely remove the basic structure and the Ni—Fe film in exposed regions. After removing the monolayer photoresist, a shield comprising the basic structure in each of the two side region is formed in the shield frame.

Figure 16:
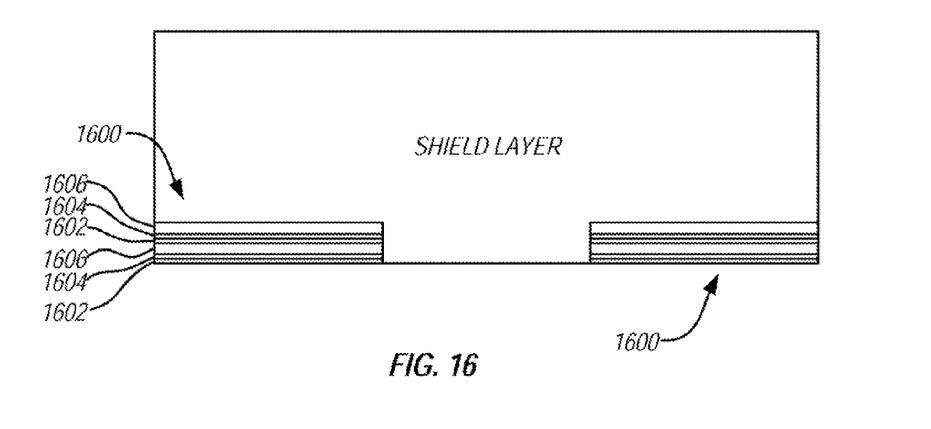
FIG. 16 is a cross sectional view in a plane parallel to the ABS of a stabilized ferromagnetic shield comprising a laminate of several basic structures in each of side regions of the shield frame and only a shield layer in a central region of the shield frame according to one embodiment of the invention.

FIG. 16 shows a shield comprising a laminate of the basic structure 1600 in each of the two side region. The basic structure 1600 preferably comprises Al—O(3)/Ni—Cr—Fe (3.2)/Ni—Fe(0.4) films used as seed layers 1602, an antiferromagnetic Ir—Mn—Cr(7.5) film used as a pinning layer 1604, and a ferromagnetic 77Co—23Fe(12 or 30*) film used as a bias layer 1606. In the fabrication process of a read head, two laminates of the basic structure comprising the Al—O/Ni—Cr—Fe/Ni—Fe/Ir—Mn—Cr/Co—Fe films are deposited in a deposition field of 100 Oe on an entire wafer, and are annealed in a field of 200 Oe for 2 hours at 240° C. in a direction parallel to the deposition field. A monolayer photoresist is applied and patterned in a photolithographic tool to expose only the central region of the shield frame. Ion milling is then applied to entirely remove the two laminates in the exposed central region. After removing the monolayer photoresist, a 82Ni—18Fe(300*) film is deposited on the entire wafer. Another monolayer photoresist is applied and patterned in a photolithographic toot to mask the shield frame. Ion milling is then applied to entirely remove the two laminates and the Ni—Fe film in exposed regions. After removing the monolayer photoresist, the shield comprising a laminate of the basic structure in each of the two side region is formed in the frame.

The merit of using either the basic structure or the laminates of the basic structure in each of the two side regions is that the conventionally used zero-magnetostriction Ni—Fe film can be still used as the shield. To ensure strong magnetostatic interactions between the shield and the bias layer, the magnetic thickness of the first laminate is preferably small enough to provide $H_{UA}$ as high as possible. In addition, the first laminate can also be farmed by a hard-magnetic Co—Pt—Cr film with a Cr seed layer for hard-magnetic stabilization, while the last laminate is still formed by the basic structure for antiferromagnetic stabilization. In other words, the laminates can comprise Al—O(3)/Cr(3)/Co—Pt—Cr(30*)/Al—O(3)/Ni—Cr—Fe(3.2)/Ni—Fe(0.4)/Ir—Mn—Cr(7.5)/Co—Fe(30*) films.

Since $H_{CE}$ is less than $H_{UA}$ a single-domain status in the Co—Fe film can be maintained when no fields are applied. In addition, the uniaxial anisotropy field ($H_K$) are expected to be about 7.5 Oe, corresponding to a permeability of about 1400. Since the permeability is high, a large amount of magnetic flux stemming from a recording medium can penetrate into the shield.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A read head, comprising:
   first and second ferromagnetic shield layers;
   first and second nonmagnetic conducting layers positioned between the first and second ferromagnetic shield layers;
   a sensor used in a current-perpendicular-to-plane (CPP) mode;
   first and second insulating layers at edges of the sensor;
   first and second longitudinal bias layers separated by the first and second insulating layers, respectively, from the sensor; and
   a basic structure positioned towards at least one of the shield layers, the basic structure comprising:
   seed layers; and
   an antiferromagnetic pinning layer, wherein one of the shield layers is formed adjacent the antiferromagnetic pinning layer,
   wherein the seed layers comprise Al—O, Ni—Cr—Fe and Ni—Fe films.

2. A read head as recited in claim 1, wherein the antiferromagnetic pinning layer is formed directly on one of the seed layers.

3. A read head as recited in claim 1, wherein the basic structure is positioned towards two ends of one of the shield layers, the basic structure having a longitudinal bias layer between the shield layer and the antiferromagnetic pinning layer.

4. A read head as recited in claim 3, wherein the basic structure is not present towards a middle of the one of the shield layers.

5. A read head as recited in claim 1, wherein the longitudinal bias layer comprises a Co—Fe film.

6. A read head as recited in claim 1, wherein the sensor is a tunneling magnetoresistance (TMR) sensor.

7. A magnetic storage system, comprising:
   magnetic media;
   at least one head for reading from and writing to the magnetic media, each head having:
      a read head portion having the structure of claim 1;
      a write head portion coupled to the read head portion;
   a slider for supporting the head; and
   a control unit coupled to the head for controlling operation of the head.

8. A read head as recited in claim 1, wherein the seed layers comprise a Al—O Film, a Ni—Cr—Fe film on the Al—O film, and a Ni—Fe film on the Ni—Cr—Fe film.

9. A read head,
   first and second ferromagnetic shield layers;
   first and second nonmagnetic conducting layers positioned between the first and second ferromagnetic shield layers;
   a sensor used in a current-perpendicular-to-plane (CPP) mode;
   first and second insulating layers at edges of the sensor;

first and second longitudinal bias layers separated by the first and second insulating layers, respectively, from the sensor; and a basic structure positioned towards at least one of the shield layers, the basic structure comprising:
seed layers; and
an antiferromagnetic pinning layer, wherein one of the shield layers is formed adjacent the antiferromagnetic pinning layer,
wherein the antiferromagnetic pinning layer comprises an Ir—Mn—Cr film.

10. A read head as recited in claim 9, wherein the basic structure is positioned towards two ends of one of the shield layers, the basic structure having a longitudinal bias layer between the shield layer and the antiferromagnetic pinning layer.

11. A read head as recited in claim 9, wherein the longitudinal bias layer comprises a Co—Fe film.

12. A read head,
first and second ferromagnetic shield layers;
first and second nonmagnetic conducting layers positioned between the first and second ferromagnetic shield layers;
a sensor used in a current-perpendicular-to-plane (CPP) mode;
first and second insulating layers at edges of the sensor;
first and second longitudinal bias layers separated by the first and second insulating layers, respectively, from the sensor; and
a basic structure positioned towards at least one of the shield layers, the basic structure comprising:
seed layers; and
an antiferromagnetic pinning layer, wherein one of the shield layers is formed adjacent the antiferromagnetic pinning layer,
wherein the basic structure is positioned towards two ends of one of the shield layers, the basic structure having a longitudinal bias layer between the shield layer and the antiferromagnetic pinning layer,
wherein the seed layers comprise Al—O, Ni—Cr—Fe and Ni—Fe films.

13. A read head as recited in claim 12, wherein the antiferromagnetic pinning layer comprises an Ir—Mn—Cr film.

14. A read head, comprising:
first and second ferromagnetic shield layers;
first and second nonmagnetic conducting layers positioned between the first and second ferromagnetic shield layers;
a sensor used in a current-perpendicular-to-plane (CPP) mode;
first and second insulating layers at edges of the sensor;
first and second longitudinal bias layers separated by the first and second insulating layers, respectively, from the sensor; and
a basic structure positioned towards at least one of the shield layers, the basic structure comprising:
seed layers comprising a Al—O film, a Ni—Cr—Fe film on the Al—O film, and a Ni—Fe film on the Ni—Cr—Fe film; and
an antiferromagnetic pinning layer, the anti ferromagnetic pinning layer being formed directly on one of the seed layers.

15. A read head as recited in claim 14, wherein the at least one of the shield layers is formed directly on the antiferromagnetic pinning layer.

16. A read head as recited in claim 14, wherein the at least one of the shield layers is stabilized by the antiferromagnetic pinning layer.

17. A read head as recited in claim 14, wherein the basic structure is positioned towards two ends of one of the shield layers, the basic structure having a longitudinal bias layer between the shield layer and the antiferromagnetic pinning layer, wherein the basic structure is not present towards a middle of the one of the shield layers.

18. A read head, comprising:
first and second ferromagnetic shield layers;
first and second nonmagnetic conducting layers positioned between the first and second ferromagnetic shield layers;
a sensor used in a current-perpendicular-to-plane (CPP) mode;
first and second insulating layers at edges of the sensor;
first and second longitudinal bias layers separated by the first and second insulating layers, respectively, from the sensor; and
a basic structure positioned towards at least one of the shield layers, the basic structure comprising:
seed layers; and
an anti ferromagnetic pinning layer, wherein one of the shield layers is formed adjacent the antiferromagnetic pinning layer,
wherein the one of the shield layers adjacent the antiferromagnetic pinning layer is formed directly on the antiferromagnetic pinning layer.

19. A read head as recited in claim 18, wherein the one of the shield layers adjacent the anti ferromagnetic pinning layer is stabilized by the antiferromagnetic pinning layer.

* * * * *

UNITED STATES PATENT AND TRADEMARK OFFICE
CERTIFICATE OF CORRECTION

PATENT NO.        : 7,697,244 B2
APPLICATION NO.   : 11/423697
DATED             : April 13, 2010
INVENTOR(S)       : Tsann Lin

Page 1 of 1

It is certified that error appears in the above-identified patent and that said Letters Patent is hereby corrected as shown below:

col. 2, line 57 replace "shied" with --shield--;
    col. 3, line 29 replace "chat" with --chart--;
    col. 5, line 24 replace "aid" with --and--;
    col. 5, line 53 replace "ABC" with --ABS--.

Signed and Sealed this

Third Day of August, 2010

David J. Kappos
*Director of the United States Patent and Trademark Office*